US007017092B2

(12) United States Patent
Hsieh

(10) Patent No.: US 7,017,092 B2
(45) Date of Patent: Mar. 21, 2006

(54) ON-CHIP DESIGN FOR MONITOR

(75) Inventor: Cheng-Ju Hsieh, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 607 days.

(21) Appl. No.: 10/178,841

(22) Filed: Jun. 25, 2002

(65) Prior Publication Data

US 2003/0237034 A1  Dec. 25, 2003

(51) Int. Cl.
*G01R 31/3181* (2006.01)
*G01R 31/319* (2006.01)

(52) U.S. Cl. .................................................. 714/724
(58) Field of Classification Search ................ 714/724; G01R 31/3181, 31/319
See application file for complete search history.

(56) References Cited

U.S. PATENT DOCUMENTS

2002/0176190 A1 * 11/2002 Cyrusian .................. 360/46

2003/0018939 A1 * 1/2003 Kinoshita et al. ........... 714/742

OTHER PUBLICATIONS

Einfeld, J. et al.; A new test circuit for the matching characterization of npn bipolar transistors; Microelectronic Test Structures, 2004. Proceedings. ICMTS '04. The International Conference on , Mar. 22-25, 2004; pp. 127-131.*

* cited by examiner

*Primary Examiner*—R. Stephen Dildine
(74) *Attorney, Agent, or Firm*—Winston Hsu

(57) ABSTRACT

A monitoring device on-chip. The monitoring device includes characteristic circuits, test circuits, and select circuits and is incorporated into an integrated circuit. The test circuit is cascaded by the characteristic circuit and a select circuit is incorporated to switch to output the test signal or the characteristic signal. There is another select circuit to switch the output signal of the integrated circuit in a normal mode or the signal of the output end of the characteristic circuit. Therefore, the output end of the select circuit can output the integrated circuit's signals, test signals, and characteristic signals without additional output pins.

22 Claims, 7 Drawing Sheets

| C1 | C2 | C3 | |
|---|---|---|---|
| 0 | X | X | Normal mode |
| 1 | 0 | 0 | IO Test mode |
| 1 | 0 | 1 | IO Test mode |
| 1 | 1 | 0 | Characterisitic mode |

ON-CHIP DESIGN FOR MONITOR

BACKGROUND OF THE INVENTION

1. Field of the Invention

The invention relates to a characteristic monitoring device on a chip. More particularly, the invention relates to the field of monitoring parameters of chips by measuring signal's delays.

2. Description of the Related Art

Conventional on-chip test circuits are used for testing parameters of chips, for example, utilizing a string of logic gates to test input levels Vil-Vih, output levels Vol-Voh, and connectivities of pads. FIG. 8 shows a diagram of conventional strings of logic gates. A pulse signal sequence propagates through input pads I1-I4 in order, changing one pin low at a time, and then going back high, in reverse order, changing one pin at a time. Delayed by the NAND gates 1-2-3-4, the NANDout outputs the pulse signal sequence. The input levels Vil and Vih can be measured at the input pads I1-I2-I3-I4. The output level Vol and Voh can be measured at the output node NANDout.

The other characteristics of chips cannot be obtained by conventional strings of logic gates. There is a need for adding pads or changing test circuit structure for measuring the other characteristics. Under the condition without changing test circuit structure and adding too many pins overhead, a need therefore exists for a test circuit capable of measuring parameters of chips mentioned above and the other characteristics of chips.

SUMMARY OF THE INVENTION

It is therefore an object of the present invention to provide an on-chip device design that affords an ability to monitor parameters on a chip.

To achieve the above objects, the present invention provides an on-chip device incorporated into an integrated circuit. According to the embodiment of the invention, the monitoring device includes characteristic circuits, test circuits, and select circuits.

The characteristic circuits are of various kinds according to parameters to be characterized, such as inverter strings, long delay lines, and delay circuits. For example, threshold voltages of an inverter relate to delays of inverter strings, thus inverter strings can characterize inverter's threshold.

Besides measuring test signals, the embodiment of the invention is capable of measuring parameters of chips. The test circuit is cascaded by the characteristic circuit and a select circuit is incorporated in the characteristic circuit, thus the output end of the characteristic circuit can be switched by a select signal to output the test signal or the characteristic signal. There is another select circuit to switch the output signal of the integrated circuit in normal mode or the signal of the output end of the characteristic circuit. Therefore, the output end of the select circuit can output an integrated circuit's signals, test signals, and characteristic signals without additional output pins.

For high-speed requirements, the characteristic circuits are inserted into the test circuit, such as a tree structure of NAND gates. The characteristic circuits are arranged in branches of NAND gates. The select signals are used to enable or disable the characteristic circuits. Similarly, the output end of the tree structure can an output integrated circuit's signals, test signals, and characteristic signals without additional output pins.

BRIEF DESCRIPTION OF THE DRAWINGS

The aforementioned objects, features and advantages of this invention will become apparent by referring to the following detailed description of the preferred embodiment with reference to the accompanying drawings, wherein.

DETAILED DESCRIPTION OF THE PREFERRED EMBODIMENTS

The First Embodiment

Figure 1:
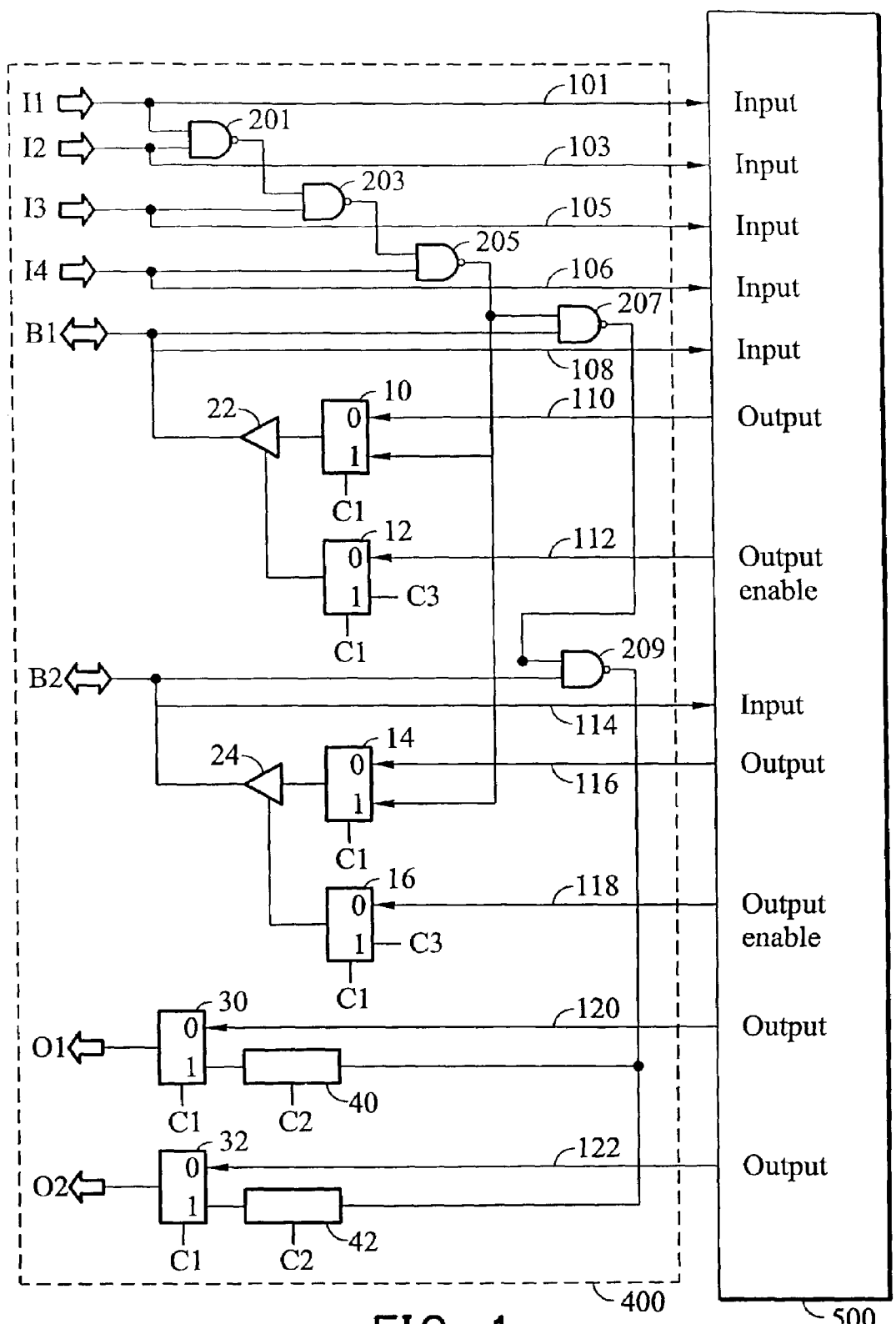
FIG. 1 shows a structure diagram of the first embodiment of the present invention.

FIG. 1 shows a structure diagram of the first embodiment of the present invention. An integrated circuit 500 and plural input output lines are shown in FIG. 1. The input lines 101-103-105 and 106 can only provide input paths to the input terminals of the integrated circuit 500. The output lines 120 and 122 can only provide output paths from the output terminals of the integrated circuit 500. The pad 11 is coupled to the input line 101 and an input end of the NAND gate 201. The pad 12 is coupled to the input line 103 and the other input end of the NAND gate 201. The output end of the NAND gate 201 is coupled to an input end of the NAND gate 203. The pad 13 is coupled to the input line 105 and the other input end of the NAND gate 203. The output end of the NAND gate 203 is coupled to an input end of the NAND gate 205. The pad 14 is coupled to the input line 106 and the other input end of the NAND gate 205. The output end of the NAND gate 205 is coupled to an input end of the NAND gate 207. The bidirectional pad B1 is coupled to the other input end of the NAND gate 207 and the input line 108. The output line 110 is coupled to the first input end of the select circuit 10. The output end of the NAND gate 205 is coupled to the second input end of the select circuit 10. The control end of the select circuit 10 receives a first select signal C1. The output end of the select circuit 10 is coupled to the input end of the buffer 22. The output end of the buffer 22 is coupled to the bidirectional pad B1. The output line 112 is coupled between the output enable end of the integrated circuit 500 and the first input end of the select circuit 12. The second input end of the select circuit 12 receives the third select signal C3. The control end of the select circuit 12 receives the first select signal C1.

The output end of the NAND gate 207 is coupled to an input end of the NAND gate 209. The bidirectional pad B2 is coupled to the other input end of the NAND gate 209 and the input line 114. The output line 116 is coupled to the first input end of the select circuit 14. The output end of the NAND gate 205 is coupled to the second input end of the select circuit 14. The control end of the select circuit 14 receives the first select signal C1. The output end of the select circuit 14 is coupled to the input end of the buffer 24.

The output end of the buffer 24 is coupled to the bidirectional pad B2. The output line 118 is coupled between the output enable end of the integrated circuit 500 and the first input end of the select circuit 16. The second input end of the select circuit 16 receives the third select signal C3. The control end of the select circuit 16 receives the first select signal C1. The output end of the select circuit 16 is coupled to the enable end of the buffer 24.

The output line 120 is coupled between the output end of the integrated circuit 500 and the first input end of the select circuit 30. The output end of the NAND gate 209 is coupled to the input end of the characteristic circuit 40. The control end of the characteristic circuit 40 receives the second select signal C2 for enabling. The output end of the characteristic circuit 40 is coupled to the second input end of the select circuit 30. The output end of the select circuit 30 is coupled to the output pad O1.

The output line 122 is coupled between the output end of the integrated circuit 500 and the first input end of the select circuit 32. The output end of the NAND gate 209 is coupled to the input end of the characteristic circuit 42. The control end of the characteristic circuit 42 receives the second select signal C2 for controlling enabling of the characteristic circuit 42. The output end of the characteristic circuit 42 is coupled to the second input end of the select circuit 32. The output end of the select circuit 32 is coupled to the output pad O2.

Figure 2:
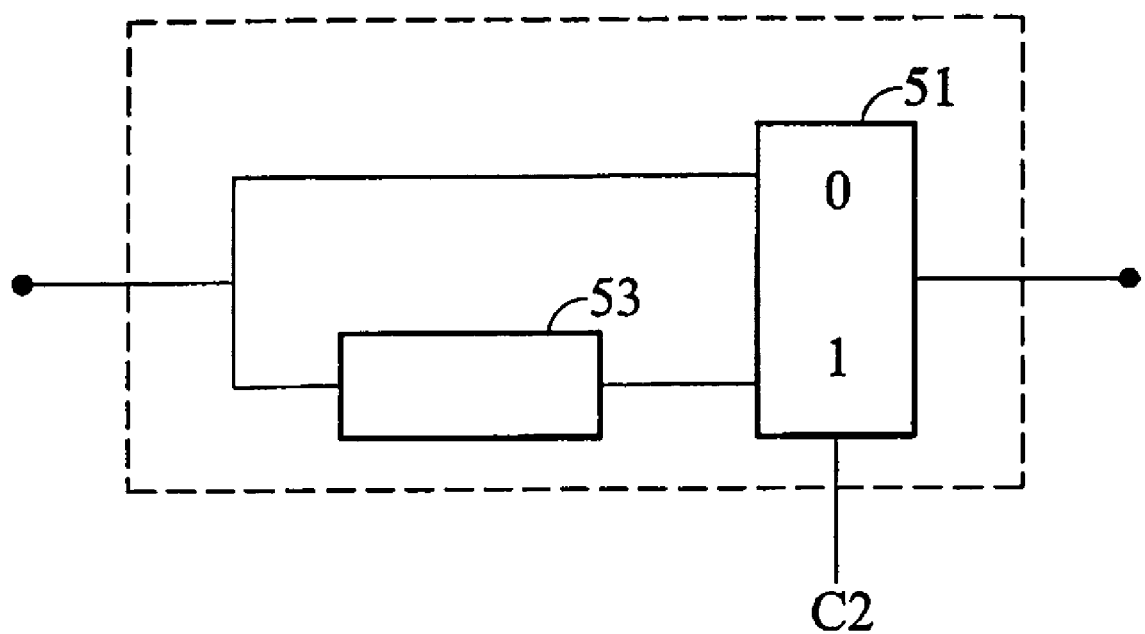
FIG. 2 shows a block diagram of the characteristic circuits 40 and 42.
Figure 3A:
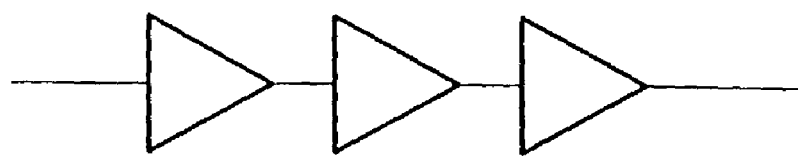
FIGS. 3A, 3B, 3C shows schematic diagrams of monitoring circuits.
Figure 3B:
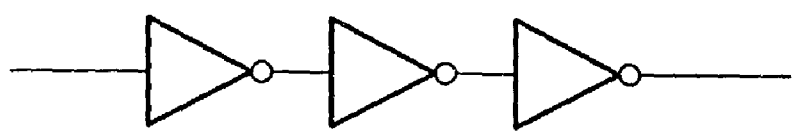
Figure 3C:
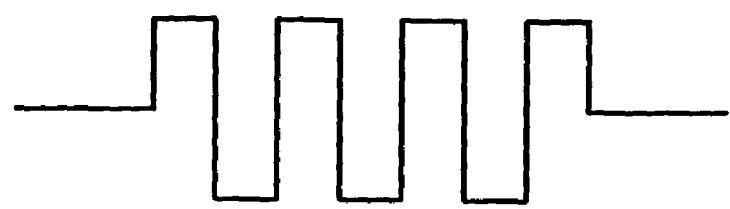

FIG. 2 shows a block diagram of the characteristic circuits 40 and 42. The characteristic circuit 40 includes monitoring circuit 53, select circuit 51. The input end of the characteristic circuit 40 is coupled to the input end of the monitoring circuit 53 and coupled to the first input end of the select circuit 51. The output end of monitor circuit 53 is coupled the second input end of the select circuit 51. The control end of the select circuit 51 is the control end of the characteristic circuit 40. The output end of the select circuit 51 is the output end of the characteristic circuit 40. The monitoring circuit 53 can be a delay cell, a string of inverters, or a long signal line, as shown in FIG. 3A, FIG. 3B, and FIG. 3C.

Figures 4, 5:
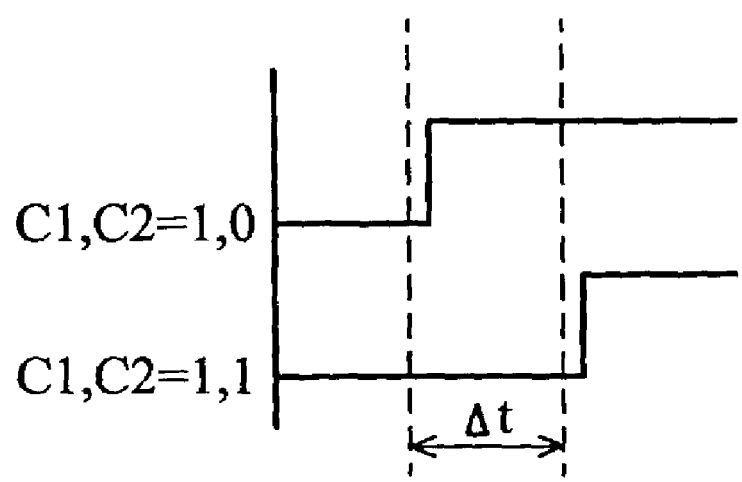
FIG. 4 shows a table for operation according the first embodiment of the present invention.
FIG. 5 shows the waveforms of the characteristic delays.

NAND gates 201, 203, 205, 207, and 209 form a string of logic test circuit. FIG. 4 shows a table for operation according the first embodiment of the present invention. When the first select signal C1 is 0, i.e. low logic level, the characteristic monitoring device 400 operates in a normal mode. The select circuit 10 outputs the signal of the output line 110. The select circuit 12 outputs the signal of the output line 112. The select circuit 14 outputs the signal of the output line 116. The select circuit 16 outputs the signal of the output line 118. The select circuit 30 outputs the signal of the output line 120. The select circuit 32 outputs the signal of the output line 122.

When the first select signal C1 is 1, i.e. high logic level, and the second select signal C2 is 0, i.e. low logic level, the characteristic monitoring device 400 operates in a test mode. When the third select signal C3 is 0, i.e. low logic level, the bidirectional pads B1 and B2 is set to be input pads. The select circuit 10 outputs the signal of the NAND gate 205. The select circuit 12 outputs a low logic level, thus the buffer 22 is disabled and cannot output the signal of the select circuit 10, i.e. cannot output the output signal of the NAND gate 205.

The select circuit 14 outputs the signal of the NAND gate 205 and the select circuit 16 outputs a low level, thus the buffer 24 is disabled and cannot output the signal of the select circuit 14, i.e. cannot output the output signal of the NAND gate 205. The characteristic circuit 40 outputs the test signal of the NAND gate 209. The select circuit 30 outputs the output signal of the characteristic circuit 40, i.e., outputs the test signal of the NAND gate 209. The characteristic circuit 42 outputs the test signal of the NAND gate 209. The select circuit 32 outputs the output signal of the characteristic circuit 42, i.e., outputs the test signal of the NAND gate 209.

When the first select signal C1 is 1, i.e. high logic level and the second select signal C2 is 0, i.e. low logic level, the characteristic monitoring device 400 operates in a test mode. When the third select signal C3 is 1, i.e. high logic level, the bidirectional pads B1 and B2 is set to be output pads. The select circuit 10 outputs the signal of the NAND gate 205. The select circuit 12 outputs a high logic level, thus the buffer 22 is enabled and outputs the signal of the select circuit 10, i.e. outputs the output signal of the NAND gate 205. The select circuit 14 outputs the signal of the NAND gate 205 and the select circuit 16 outputs a high level, thus the buffer 24 is enabled and outputs the signal of the select circuit 14, i.e. outputs the output signal of the NAND gate 205. The characteristic circuit 40 outputs the test signal of the NAND gate 209. The select circuit 30 outputs the output signal of the characteristic circuit 40, i.e., outputs the test signal of the NAND gate 209. The characteristic circuit 42 outputs the test signal of the NAND gate 209. The select circuit 32 outputs the output signal of the characteristic circuit 42, i.e., outputs the test signal of the NAND gate 209.

When the first select signal C1 is 1, i.e. high logic level and the second select signal C2 is 1, i.e. high logic level, the characteristic monitoring device 400 operates in a characteristic mode. When the third select signal C3 is 0, i.e. low logic level, the bidirectional pads B1 and B2 is set to be input pads. The select circuit 10 outputs the signal of the NAND gate 205. The select circuit 12 outputs a low logic level, thus the buffer 22 is disabled and cannot output the signal of the select circuit 10, i.e. cannot output the output signal of the NAND gate 205.

The select circuit 14 outputs the signal of the NAND gate 205 and the select circuit 16 outputs a low level, thus the buffer 24 is disabled and cannot output the signal of the select circuit 14, i.e. cannot output the output signal of the NAND gate 205. The characteristic circuit 40 outputs the characteristic signal of the monitoring circuit 53. The select circuit 30 outputs the output signal of the characteristic circuit 40, i.e., outputs the characteristic signal of the monitoring circuit 53. The characteristic circuit 42 outputs the characteristic signal of the monitoring circuit 53. The select circuit 32 outputs the output signal of the characteristic circuit 42, i.e., outputs the characteristic signal of the monitoring circuit 53.

FIG. 5 shows the waveforms of the characteristic delays. When the first select signal C1 is 1 and the second select signal C2 is 0, the output pad O1 outputs the test signal. When the first select signal C1 is 1 and the second select signal C2 is 1, the output pad O1 outputs the characteristic signal. As shown in FIG. 5, there is a characteristic delay $\Delta t$ between the characteristic signal and the test signal determined by the structure of the monitoring circuit 53. By the relation between parameters of the monitoring circuit 53 and the characteristic delay $\Delta t$, the characteristics of the chip, the monitoring circuit is on, is obtained.

The Second Embodiment

Figure 6:
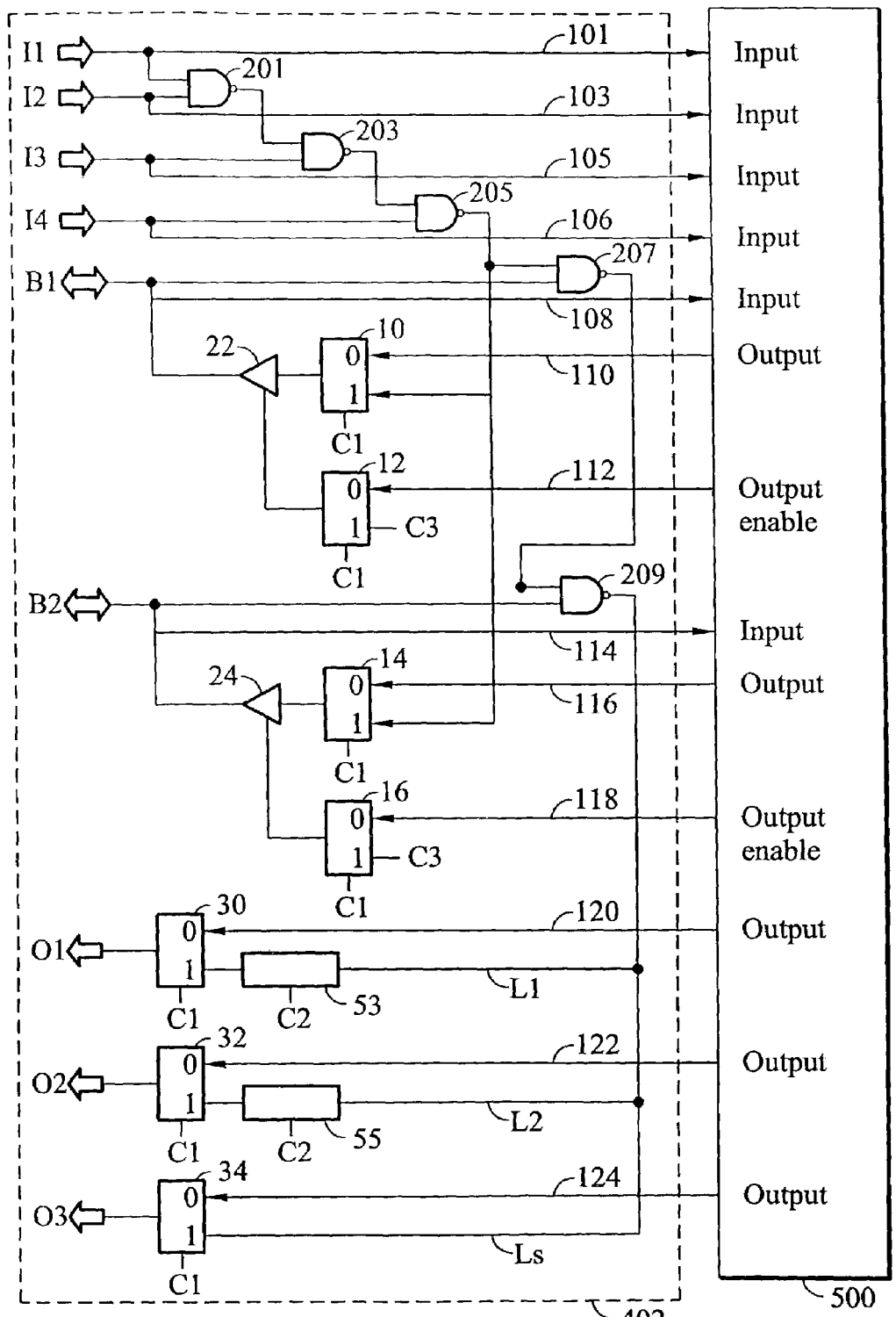
FIG. 6 shows a structure diagram of the second embodiment of the present invention.

FIG. 6 shows a structure diagram of the second embodiment of the present invention. The difference from the first embodiment is that the controlling structure for the characteristic signal only requires the first select signal to select the test mode or characteristic mode.

The output line 120 is coupled between the output end of the integrated circuit 500 and the first input end of the select circuit 30. The output end of the NAND gate 209 is coupled to the input end of the monitoring circuit 53. The output end of the monitoring circuit 53 is coupled to the second input end of the select circuit 30. The output end of the select circuit 30 is coupled to the output pad O1.

The output line 122 is coupled between the output end of the integrated circuit 500 and the first input end of the select circuit 32. The output end of the NAND gate 209 is coupled to the input end of the monitoring circuit 55. The output end of the monitoring circuit 55 is coupled to the second input end of the select circuit 32. The output end of the select circuit 32 is coupled to the output pad O2.

The output line 124 is coupled between the output end of the integrated circuit 500 and the first input end of the select circuit 34. The output end of the NAND gate 209 is coupled to the second input end of the select circuit 34. The output end of the select circuit 34 is coupled to the output pad O3.

When the first select signal C1 is 0, i.e. low logic level, the characteristic monitoring device 402 operates in a normal mode. The select circuit 30 outputs the signal of the output line 120. The select circuit 32 outputs the signal of the output line 122. The select circuit 34 outputs the signal of the output line 124.

When the first select signal C1 is 1, i.e. high logic level, the characteristic monitoring device 402 operates in the test mode and the characteristic mode simultaneously. The select circuit 30 outputs the characteristic signal of the monitoring circuit 53. The select circuit 32 outputs the characteristic signal of the monitoring circuit 55. The select circuit 34 outputs the test signal of the NAND gate 209.

The signal line L1 is coupled between the output end of the NAND gate 209 and the monitoring circuit 53. The signal line L2 is coupled between the output end of the NAND gate 209 and the monitoring circuit 55. The signal line Ls is coupled between the output end of the NAND gate 20 and the second input end of the select circuit 34. The delays resulted from the signal lines L1, L2, and Ls must be the same.

The output pad O1 outputs the test signal. The output pad O2 outputs the characteristic signal. The output pad O3 outputs the characteristic signal. As shown in FIG. 5, there is a characteristic delay Δt between the characteristic signal and the test signal, determined by the structure of the monitoring circuit 53. By the relation between parameters of the monitoring circuit 53 and the characteristic delay Δt, the characteristics of the chip, the monitoring circuit is on, is obtained.

The Third Embodiment

Figure 7:
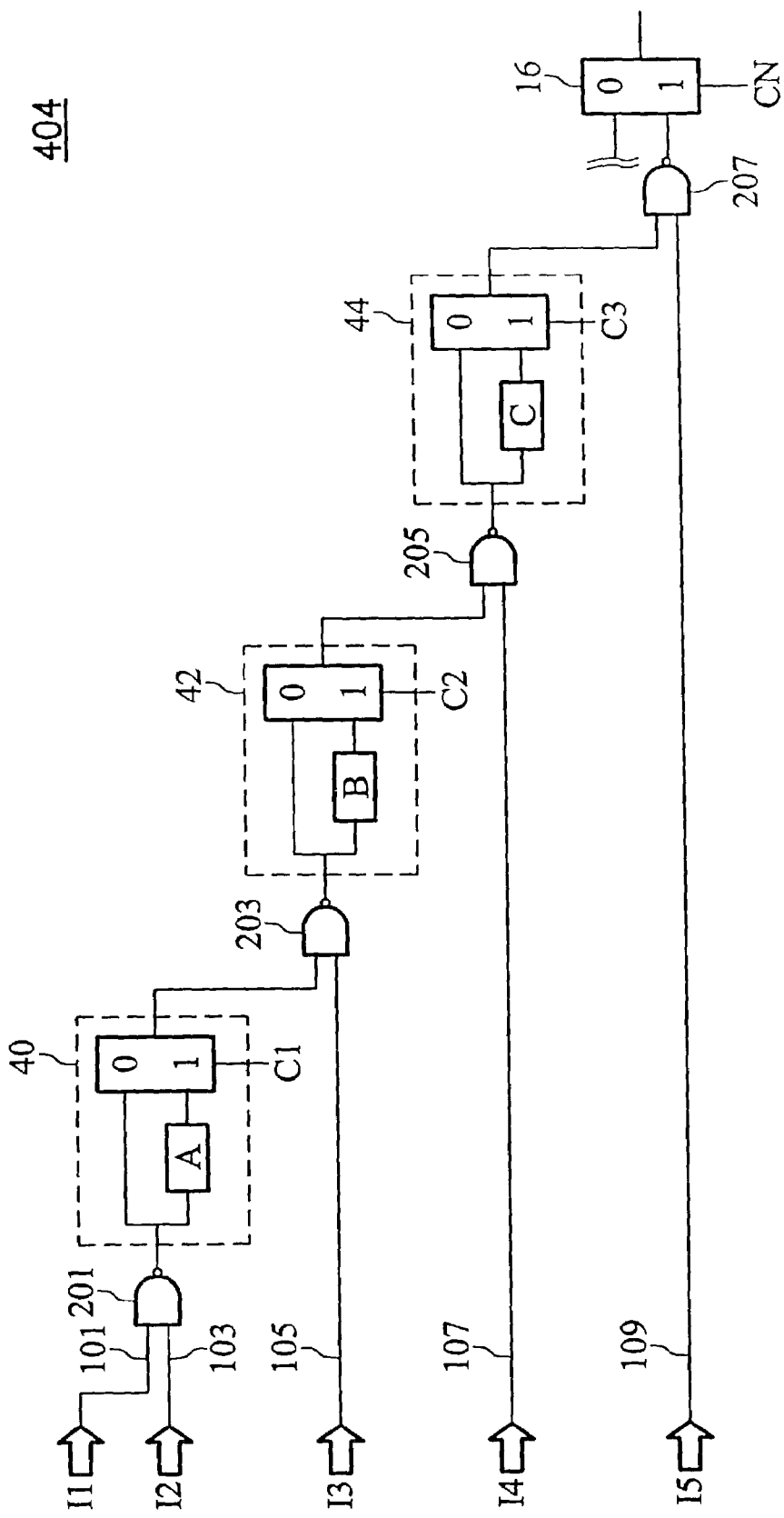
FIG. 7 shows a structure diagram of the third embodiment of the present invention.
Figure 8:
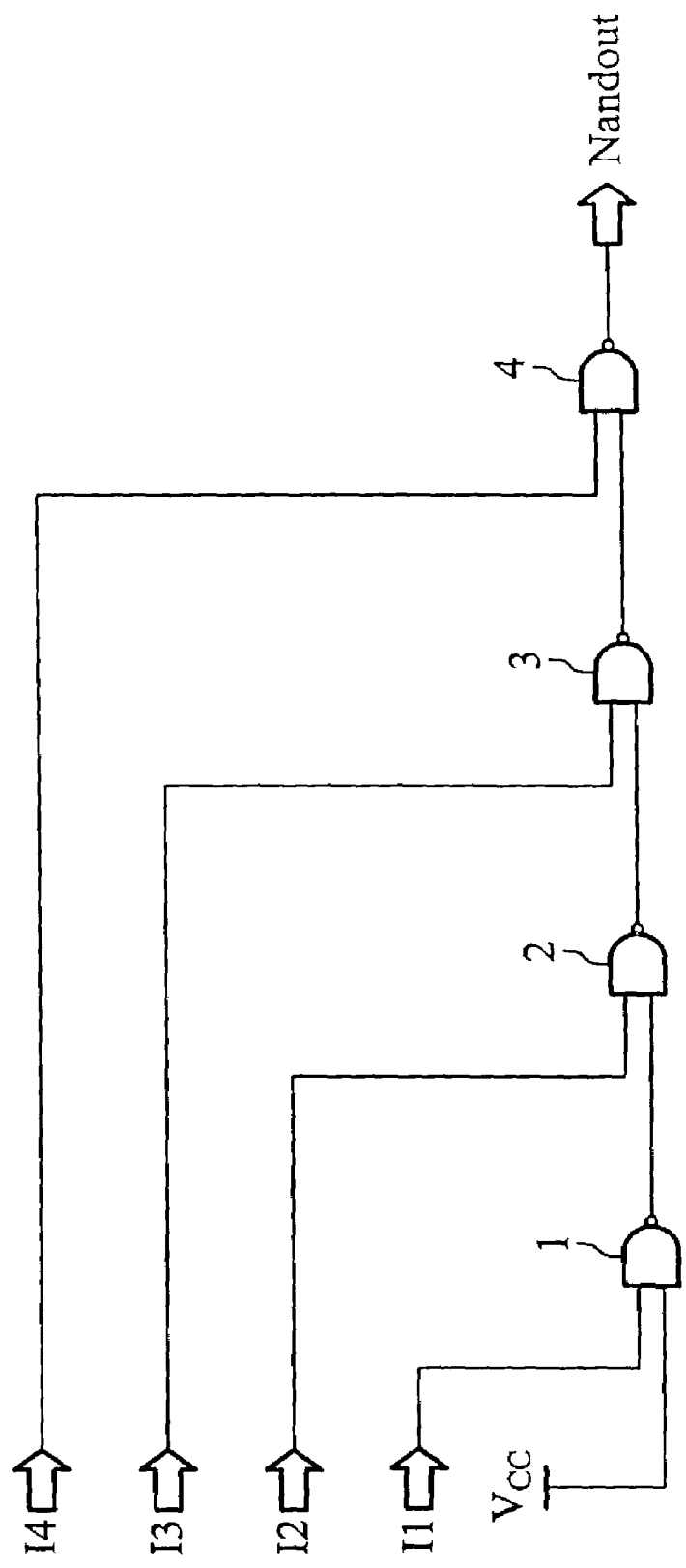
FIG. 8 shows a diagram of conventional strings of logic gates.

FIG. 7 shows a structure diagram of the third embodiment of the present invention. As shown in FIG. 7, the NAND gates 207, 203, 205, and 207, the characteristic circuits 40, 42, and 44, and the select circuit 16 are included.

The input line 1 01 is coupled between the input pad 11 and the first input end of the NAND gate 201. The input line 103 is coupled between the input pad 12 and the second input end of the NAND gate 201. The output end of the NAND gate 201 is coupled to the input end of the characteristic circuit 40. The control end of the characteristic 40 receives the second select signal C1. The output end of the characteristic circuit 40 is coupled to the first input end of the NAND gate 203. The input line 105 is coupled between the input pad 13 and the second input end of the NAND gate 203. The output end of the NAND gate 203 is coupled to the input end of the characteristic circuit 42. The control end of the characteristic 42 receives the third select signal C2. The output end of the characteristic 42 is coupled to the first input end of the NAND gate 205. The input line 107 is coupled between input pad 14 and the second input pad of the NAND gate 205. The output end of the NAND gate 205 is coupled to the input end of the characteristic circuit 44. The control end of the characteristic circuit 44 receives the fourth select signal C3. The output end of the characteristic circuit 44 is coupled to the first input end of the NAND 207. The input line 109 is coupled between the input pad 15 and the second input end of the NAND gate 207. The NAND gates 201, 203, 205, 207 and the characteristic circuit 40, 42, 44 form a tree structure. The first input end of the select circuit 16 is coupled to an input pad. The output end of the NAND gate 207 is couple to the second input end of the select circuit 16. The control end of the select circuit 16 receives the first select signal CN.

When the first select signal CN is 0, i.e. low logic level, the characteristic monitoring device 404 operates in a normal mode. The select circuit 16 outputs the signal of the first input end.

When the first select signal CN is 1, the second, the third, and the fourth select signals C1, C2, and C3 are 0, the characteristic monitoring device 404 operates in a test mode. The select circuit 16 outputs a test signal.

When the first select signal CN is 1, i.e. high logic level, the second select signal C1 is 1, the third and the fourth select signals C2 and C3 are 0, the characteristic monitoring device 404 operates in a characteristic mode. The characteristic circuit 40 outputs the signal of monitoring circuit A. The select circuit 16 outputs a first characteristic signal. By the first characteristic signal and the test signal, the characteristic delay of the monitoring circuit A is obtained.

When the first select signal CN is 1, i.e. high logic level, the second select signal C1 is 0, the third select signal C2 is 1, and the fourth select signals C3 is 0, the characteristic monitoring device 404 operates in a characteristic mode. The characteristic circuit 42 outputs the signal of monitoring circuit B. The select circuit 16 outputs a second characteristic signal. By the second characteristic signal and the test signal, the characteristic delay of the monitoring circuit B is obtained.

When the first select signal CN is 1, i.e. high logic level, the second select signal C1 is 0, the third select signal C2 is 0, and the fourth select signals C3 is 1, the characteristic monitoring device 404 operates in a characteristic mode. The characteristic circuit 44 outputs the signal of monitoring circuit C. The select circuit 16 outputs a third characteristic signal. By the third characteristic signal and the test signal, the characteristic delay of the monitoring circuit B is obtained.

In the characteristic monitoring device 404, the characteristic circuit 40, 42, and 44 is arranged at the input ends of the tree structure, thus the loads of the normal mode are not affected.

It is suitable for high speed chips.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A characteristic monitoring device for an integrated circuit having plural input lines, plural output lines, and plural bidirectional lines and generating an output signal, comprising:
   a test circuit having plural first input ends coupled to the plural input lines and plural second input lines coupled to the plural bidirectional lines, and an output end;
   a first select circuit having a first input end, a second input end, a control end, and an output end, wherein the first input end of the first select circuit receives the output signal of the integrated circuit, the control end of the first select circuit receives a first select signal for selecting the first input end or the second input end coupling to the output end, and the output end of the first select circuit is coupled to the output line; and
   plural characteristic circuits, wherein the characteristic circuit has an input end and an output end, wherein the input end of the characteristic circuit is coupled to the output end of the test circuit, the output end of the characteristic circuit is coupled to the corresponding second input end of the first select circuit.

2. The characteristic monitoring device as claimed in claim 1, wherein the characteristic circuit further comprises:
   a second select circuit having a first input end, a second input end, a control end, and an output end, wherein the first input end of the second select circuit is coupled to the output end of the test circuit, the control end of the second select circuit receives a second select signal for selecting the first input end or the second input end coupling to the output end, the output end of the second select circuit is coupled to the output line; and
   a monitoring circuit having an input end and an output end, wherein the input end of the monitoring circuit is coupled to the output end of the test circuit, the output end of the monitoring circuit is coupled to the second input end of the second select circuit.

3. The characteristic monitoring device as claimed in claim 2, wherein the monitor circuit is a delay circuit.

4. The characteristic monitoring device as claimed in claim 2, wherein the monitoring circuit is a string of inverters.

5. The characteristic monitoring device as claimed in claim 2, wherein the monitoring circuit is a long signal line.

6. The characteristic monitoring device as claimed in claim 2, wherein when the first select signal is a low logic level, the output end of the first select circuit outputs the output signal of the integrated circuit.

7. The characteristic monitoring device as claimed in claim 2, wherein when the first select signal is a high logic level and the second select signal is a low logic level, the output end of the first select circuit outputs a test signal of the output end of the test circuit.

8. The characteristic monitoring device as claimed in claim 2, wherein when the first select signal is a high logic level and the second select signal is a high logic level, the output end of the first select circuit outputs a characteristic signal of the output end of the monitoring circuit.

9. The characteristic monitoring device as claimed in claim 7 wherein a characteristic delay of the integrated circuit is obtained by the test signal and the characteristic signal.

10. The characteristic monitoring device as claimed in claim 1, wherein the characteristic circuit further comprises a monitoring circuit having an input end and an output end, wherein the input end of the monitoring circuit is coupled to the output end of the test circuit, and the output end of the monitoring circuit is coupled to the second input end of the second select circuit.

11. The characteristic monitoring device as claimed in claim 10, further comprising a third select circuit having a first input end, a second input end, a control end, and an output end, wherein the first input end of the third select circuit receives the output signal of the integrated circuit, the second input end of the third select circuit is coupled to the output end of the test circuit, the control end of the third select circuit receives the first select signal for selecting the first input end or the second input end coupling to the output end, and the output end of the third select circuit is coupled to the output line.

12. The characteristic monitoring device as claimed in claim 11, further comprising:
   plural first signal lines coupled between the output end of the test circuit and the input ends of the plural characteristic circuits; and
   a second signal line coupled between the output end of the test circuit and the second input end of the third select circuit, wherein the delay resulting from the first signal line equals the delay resulting from the second signal line.

13. The characteristic monitoring device as claimed in claim 11, wherein when the first select signal is a low logic level, the output end of the first select circuit outputs the output signal of the integrated circuit, and the output end of the third select circuit outputs the output signal of the integrated circuit.

14. The characteristic monitoring device as claimed in claim 11, wherein when the first select signal is a high logic level, the output end of the first select circuit outputs a test signal of the output end of the test circuit, and the output end of the third select circuit outputs a characteristic signal of the output end of the characteristic circuit.

15. The characteristic monitoring device as claimed in claim 14 wherein a characteristic delay of the integrated circuit is obtained by the test signal and the characteristic signal.

16. A characteristic monitoring device for an integrated circuit having plural input lines, plural output lines, and plural bidirectional lines and generating an output signal, comprising:
   plural coupling circuits, each having a first input end, a second input end, and an output end, wherein the first input end of each coupling circuit is coupled to its corresponding input line;
   plural characteristic circuits, each having an input end, a control end, and an output end, wherein the input end of each characteristic circuit is coupled to an output end of the corresponding coupling circuit, the control end of each characteristic circuit receives a corresponding second select signal, and the output end of each characteristic circuit is coupled to a second input end of another corresponding coupling circuit, whereby the plural coupling circuits and plural characteristic circuits form a tree structure having an output end; and
   a first select circuit having first input end, a second input end, a control end, and an output end, wherein the first input end of the first select circuit receives the output signal of the integrated circuit, the second input end of the first select signal is coupled to the output end of the tree structure, the control end of the first select circuit receives a first select signal for selecting the first input end or the second input end coupling to the output end, and the output end of the first select circuit is coupled to the output line.

17. The characteristic monitoring device as claimed in claim 16, wherein the characteristic circuit further comprises:
   a second select circuit having a first input end, a second input end, a control end, and an output end, wherein the first input end of the second select circuit is coupled to the output end of the corresponding coupling circuit, the control end of the second select circuit receives a second select signal for selecting the first input end or the second input end coupling to the output end, and the output end of the second select circuit is coupled to the output end of another corresponding coupling circuit; and
   a monitoring circuit having an input end and an output end, wherein the input end of the monitoring circuit is coupled to the output end of the corresponding coupling circuit, and the output end of the monitoring circuit is coupled to the second input end of the second select circuit.

18. The characteristic monitoring device as claimed in claim 16, wherein the coupling circuit is a NAND gate.

19. The characteristic monitoring device as claimed in claim 16, wherein when the first select signal is a low logic level, the output end of the first select circuit outputs the output signal of the integrated circuit.

20. The characteristic monitoring device as claimed in claim 16, wherein when the first select signal is a high logic level and the corresponding second select signal is a low logic level, the output end of the first select circuit outputs a test signal of the output end of the tree structure.

21. The characteristic monitoring device as claimed in claim 16, wherein when the first select signal is a high logic level and the corresponding second select signal is a high logic level, the output end of the first select circuit outputs a characteristic signal of the output end of the tree structure.

22. The characteristic monitoring device as claimed in claim 20 wherein a characteristic delay of the characteristic monitoring circuit is obtained by the test signal and the characteristic signal.

* * * * *